(12) United States Patent
Tsuda

(10) Patent No.: US 11,728,210 B2
(45) Date of Patent: Aug. 15, 2023

(54) MANUFACTURING METHOD OF ORIGINAL PLATE AND SEMICONDUCTOR DEVICE

(71) Applicant: KIOXIA CORPORATION, Tokyo (JP)

(72) Inventor: Hirotaka Tsuda, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/187,696

(22) Filed: Feb. 26, 2021

(65) Prior Publication Data

US 2021/0287935 A1    Sep. 16, 2021

(30) Foreign Application Priority Data

Mar. 13, 2020 (JP) ................. 2020-043814

(51) Int. Cl.
*H01L 21/768* (2006.01)
*H01L 21/027* (2006.01)
*H01L 21/02* (2006.01)
*H01L 21/311* (2006.01)

(52) U.S. Cl.
CPC .... *H01L 21/76817* (2013.01); *H01L 21/0274* (2013.01); *H01L 21/02118* (2013.01); *H01L 21/31144* (2013.01)

(58) Field of Classification Search
CPC ......... H01L 21/76817; H01L 21/02118; H01L 21/0274; H01L 21/31144; H01L 21/76813; H01L 21/76811; H01L 21/76816; G03F 7/0002
USPC ............ 430/325; 438/702; 427/256; 118/504
See application file for complete search history.

(56) References Cited

U.S. PATENT DOCUMENTS

| 7,396,475 | B2 | 7/2008 | Sreenivasan | |
|---|---|---|---|---|
| 2003/0112576 | A1 | 6/2003 | Brewer | |
| 2004/0224261 | A1 | 11/2004 | Resnick | |
| 2010/0104984 | A1* | 4/2010 | Shiobara | B82Y 10/00 430/319 |
| 2011/0062623 | A1* | 3/2011 | Saito | G03F 7/0002 264/219 |
| 2011/0315077 | A1 | 12/2011 | Asano | |

FOREIGN PATENT DOCUMENTS

| JP | 2006524919 A | 11/2006 |
|---|---|---|
| JP | 2007521645 A | 8/2007 |
| JP | 2010-219456 A | 9/2010 |
| JP | 2011009464 A | 1/2011 |
| JP | 2013140917 A | 7/2013 |
| JP | 2015103672 A | 6/2015 |
| JP | 2015204399 A | 11/2015 |
| JP | 2018-14497 A | 1/2018 |

* cited by examiner

*Primary Examiner* — Caleen O Sullivan
(74) *Attorney, Agent, or Firm* — Kim & Stewart LLP

(57) ABSTRACT

According to one embodiment, an original plate for imprint lithography has a first surface side having a patterned portion thereon. The patterned portion includes a groove having a bottom surface recessed from a first surface to a first depth, and a columnar portion on the bottom surface and protruding from the bottom surface to extend beyond the first surface. The original plate may be used to form replica templates by imprint lithography processes. The replica templates can be used in semiconductor device manufacturing processes or the like.

16 Claims, 14 Drawing Sheets

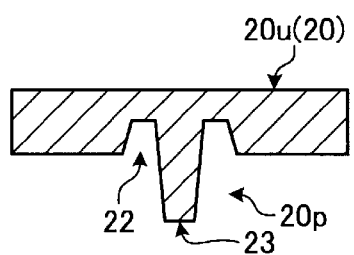
FIG. 10A
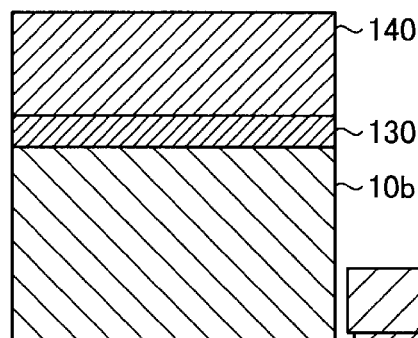
FIG. 10B
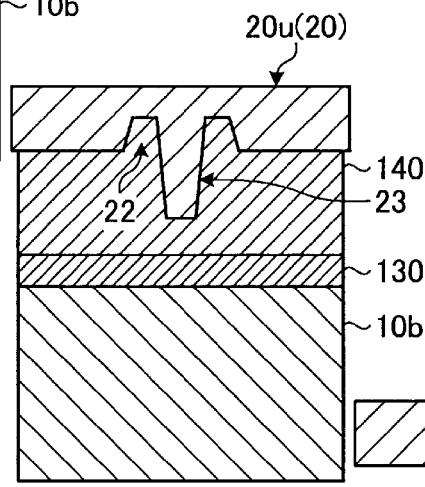
FIG. 10C
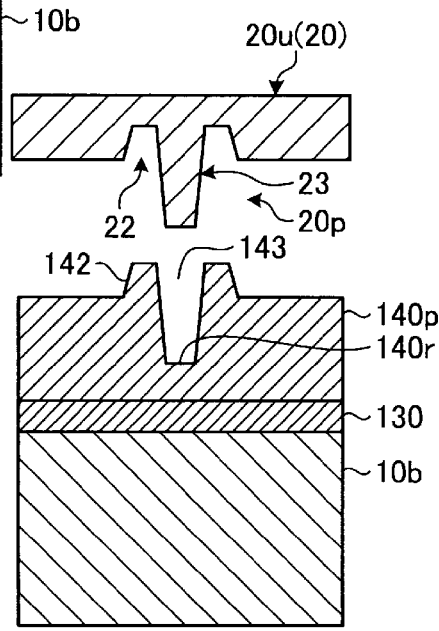

MANUFACTURING METHOD OF ORIGINAL PLATE AND SEMICONDUCTOR DEVICE

CROSS-REFERENCE TO RELATED APPLICATION

This application is based upon and claims the benefit of priority from. Japanese Patent Application No. 2020-043814, filed on Mar. 13, 2020, the entire contents of which are incorporated herein by reference.

FIELD

Embodiments described herein relate generally to a method of manufacturing an original plate, such as an imprint template or mold, and a semiconductor device.

BACKGROUND

In the manufacturing process of a semiconductor device, the dual damascene method may be used in which a via connected to a lower layer structure and an upper layer wiring connected to the via are formed together. In addition, an imprint method may be applied to the formation of the via and the upper layer wiring for the dual damascene method. In an imprint method, a resist is formed on a film-to-be-processed, then a template on which a pattern has been formed is pressed against the resist to pattern the resist. The pattern of the template is transferred to the resist. However, in some cases, if holes that are to become vias and grooves that are to become the upper layer wiring are collectively transferred to the resist in a single process, the desired shape cannot be obtained in the to-be-process film due to insufficient etch selection ratio of the imprinted resist, or the like.

BRIEF DESCRIPTION OF THE DRAWINGS

FIGS. 10A to 10C are cross-sectional views depicting aspects of a master template manufacturing method according to an embodiment.

DETAILED DESCRIPTION

Embodiments provide a manufacturing method for an original plate and a semiconductor device, which facilitates obtaining desired shapes in a film-to-be-processed.

In general, according to one embodiment, an original plate for imprint lithography has a first surface side having a patterned portion thereon. The patterned portion includes a groove having a bottom surface recessed from a first surface to a first depth, and a columnar portion on the bottom surface and protruding from the bottom surface to extend beyond the first surface.

Hereinafter, the present disclosure will be described in with reference to the drawings. The present disclosure is not limited to the following example embodiments. In addition, the components in the following embodiments include those that can be easily conceived by those skilled in the art or those that are substantially the same.

[Structure of Replica Template]

Figure 1A:
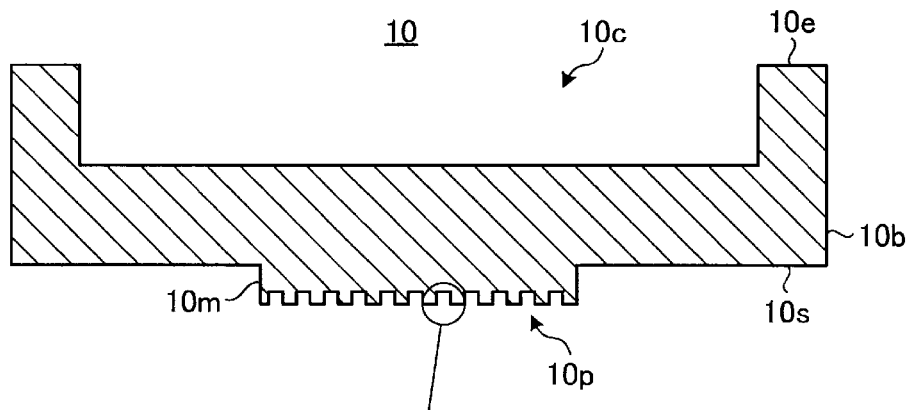
FIGS. 1A to 1C are diagrams showing an example of the configuration of a replica template according to an embodiment.
Figure 1B:
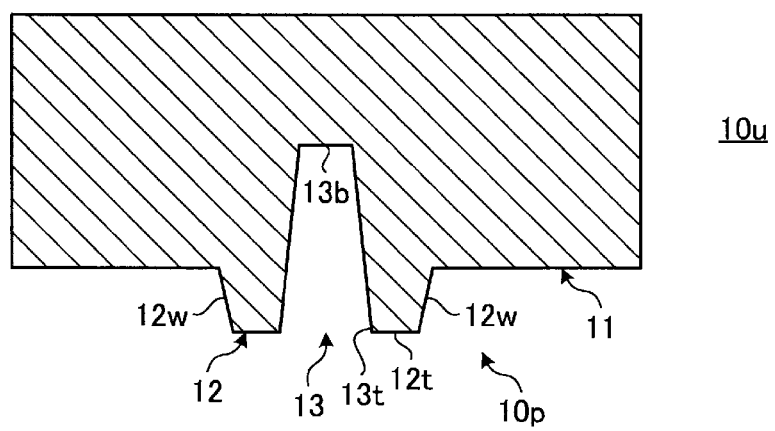
Figure 1C:
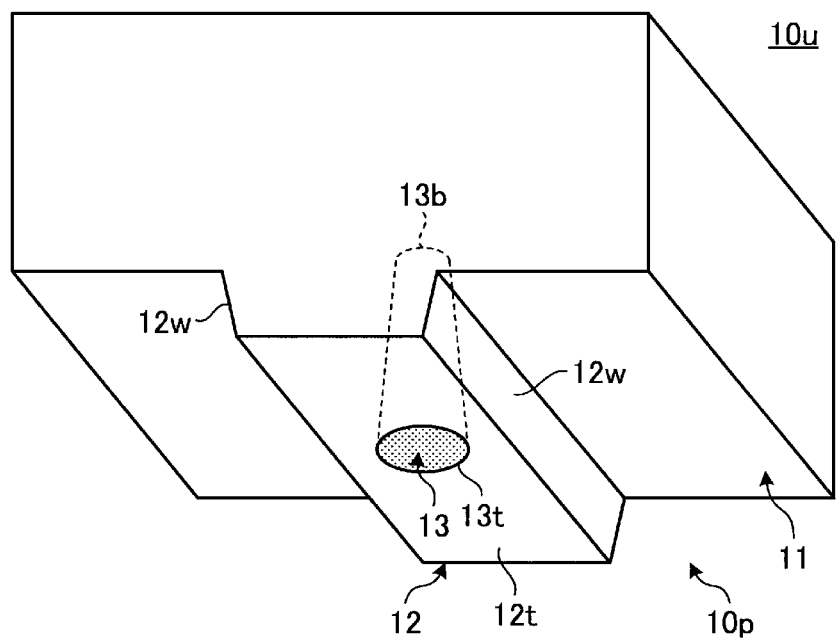

FIGS. 1A to 1C are diagrams showing an example of the configuration of a replica template 10 according to an embodiment. FIG. 1A is a cross-sectional view, FIG. 1B is a partially enlarged cross-sectional view, and FIG. 1C is a partial perspective view.

The replica template 10 is a template (mold) for imprinting. A pattern 10$p$ is in the replica template 10. This pattern 10$p$ is transferred to a resist film disposed on a film-to-be-processed. The film-to-be-processed can be a part of the final semiconductor device product or the like. The replica template 10 is mass-produced from a master template. The master template has a topographic pattern which is the inverse of the pattern 10$p$ in the replica template 10.

In the present specification, the direction in which the surfaces having the patterns of the replica template 10 and the master template face is referred to as upward, and the opposite direction is referred to as downward. Therefore, in the present specification, in the configurations having respective patterns of the replica template 10 and the master template, there may be cases where the distance from a predetermined position to a certain position above is referred to as height and the distance from a predetermined position to a certain position below is referred to as depth.

As shown in FIG. 1A, the replica template 10 includes a base material 10$b$ made of a transparent material such as glass or quartz. The base material 10$b$ has, for example, a rectangular planar shape. On a main surface 10$s$ of the base material 10$b$, a mesa portion 10$m$ protruding from the main surface 10$s$ is disposed. The mesa portion 10$m$ is disposed in the center of the base material 10$b$, for example. The other main surface 10$e$ of the base material 10$b$ is provided with a counterbore 10$c$ in which a part of the base material 10$b$ is removed from the main surface 10$e$ side.

The pattern 10$p$ is disposed on the upper surface of the mesa portion 10$m$. The pattern 10$p$ has, for example, a periodic structure in which a predetermined unit structure 10*u* is periodically repeated. FIGS. 1B and 1C are extracted unit structures 10*u* of the pattern 10*p* depicted in FIG. 1A.

As shown in FIGS. 1B and 1C, the unit structure 10*u* of the pattern 10*p* is disposed on a basal plane 11 as a first surface of the mesa portion 10*m*. The unit structure 10*u* includes, for example, a step portion 12 protruding from the basal plane 11 at a predetermined height, and a hole 13 disposed in the step portion 12.

The step portion 12 extends in a predetermined direction along the basal plane 11, for example, and has an upper surface 12*t* and side surfaces 12*w*. The upper surface 12*t* which is the upper step surface of the step portion 12 has, for example, a rectangular shape and has a substantially flat surface. The respective side surfaces 12*w* are disposed on the outer sides, in the width direction, of the upper surface 12*t*. The width direction in this context is a direction intersecting the extending direction of the step portion 12. Each side surface 12*w* extends from the upper surface 12*t* to the basal plane 11. The two side surfaces 12*w* are substantially parallel to each other in the extending direction of the step portion 12. However, the step portion 12 may have a tapered shape with the distance between the two side surfaces 12*w* increased from the upper surface 12*t* of the step portion 12 toward the basal plane 11.

As will be described further, the shape of the step portion 12 is transferred to the film-to-be-processed, which becomes, for example, an upper layer wiring in the semiconductor device. Therefore, the step portion 12 may bend in various directions and/or may extend in a curved shape or a serpentine shape, instead of extending in just one direction or in a straight line as described above.

The hole 13 has an opening 13*t* at the upper surface 12*t* of the step portion 12 and extends to a predetermined depth into the mesa portion 10*m* of the base material 10*b*. The hole 13 has a substantially flat bottom surface 13*ba*. The depth from the opening 13*t* to the bottom surface 13*b* is larger than, for example, the height of the step portion 12 from the basal plane 11. Therefore, the bottom surface 13*b* of the hole 13 is located at a position deeper than the basal plane 11 in this example.

The shape of the hole 13 is also transferred to the film-to-be-processed and ultimately becomes a via connecting the upper layer wiring to a lower layer structure, for example. Therefore, it is desirable that the cross section of the hole 13 orthogonal to the depth direction has a rounded shape such as a circular shape, an elliptical shape, or an oval shape. That is, the cross-section shape of the hole preferably has no corners. Further, the hole 13 may have a tapered shape with the diameter at the opening 13*t* being larger than the diameter at the bottom surface 13*b*.

[Manufacturing Method of Semiconductor Device]

Next, a manufacturing method of a semiconductor device 200 of the embodiment will be described with reference to FIGS. 2A to 6. FIGS. 2A to 6 are cross-sectional views showing an example of a procedure of a manufacturing method of the semiconductor device 200 according to the embodiment. In the manufacturing method of the semiconductor device 200, the replica template 10 is used and a dual damascene method, in which a via 223*v* and an upper layer wiring 222*w* (see FIG. 6) are collectively formed on an insulating film 220, is applied.

In this specification, the vertical direction in description of the semiconductor device 200 is set based on the via 223*v* and the upper layer wiring 222*w*. That is, the via 223*v* is assumed to be located below the upper layer wiring 222*w* and the upper layer wiring 222*w* is assumed to be located above the via 223*v*. The lower layer structure is located further below the via 223*v* and the upper layer wiring 222*w*. Furthermore, when the terms "above" and "below" are used, it does not necessarily mean that components having the stated vertical relationship are in contact with each other.

FIGS. 2A to 2D show how a transistor TR corresponding to a lower layer structure connected to the via 223*v* is formed.

Figure 2A:
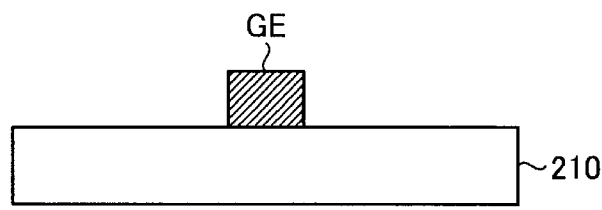
FIGS. 2A to 2D are cross-sectional views depicting aspects of a semiconductor device manufacturing method according to an embodiment.
Figure 2B:
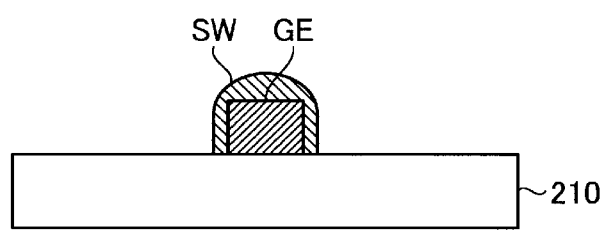
Figure 2C:
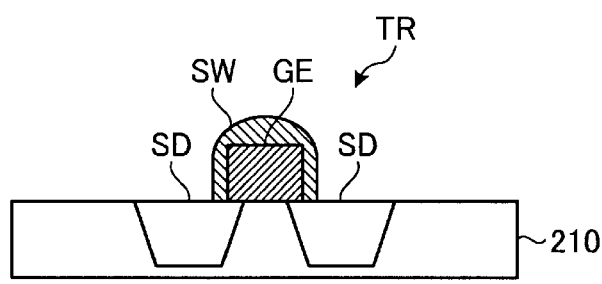

As shown in FIG. 2A, a gate electrode GE is formed on a semiconductor substrate 210 ("substrate 210") such as a silicon substrate. As shown in FIG. 2B, a sidewall spacer SW covering the gate electrode GE is formed. As shown in FIG. 2C, source and drain SDs are formed on the surface layer of the substrate 210 on both sides of the gate electrode GE, for example, by a self-alignment process.

As described above, the transistor TR including the gate electrode GE and the source and drain SD is formed. However, the method for forming the transistor TR is not limited to the above, and various methods may be used.

Figure 2D:
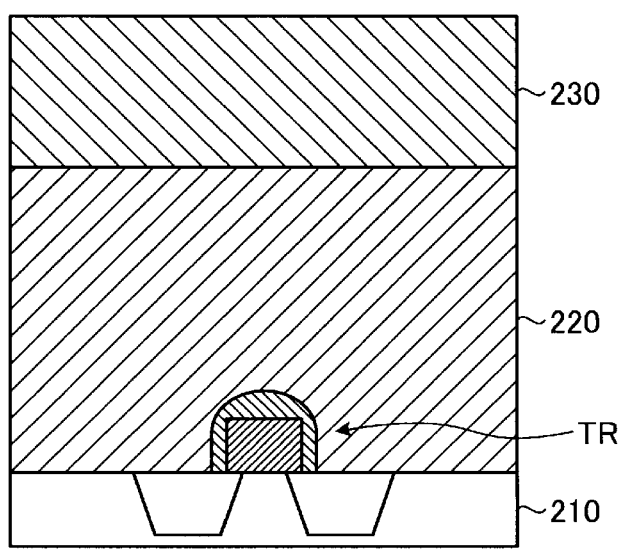

As shown in FIG. 2D, the transistor TR is then covered with the insulating film 220, such as a silicon oxide film formed from tetraethyl orthosilicate (TEOS) or the like. A carbon film 230 (e.g., carbon-based film formed from a spin-on-carbon (SOC) material or the like) is formed on the insulating film 220.

Figures 3A, 3B, 3C:
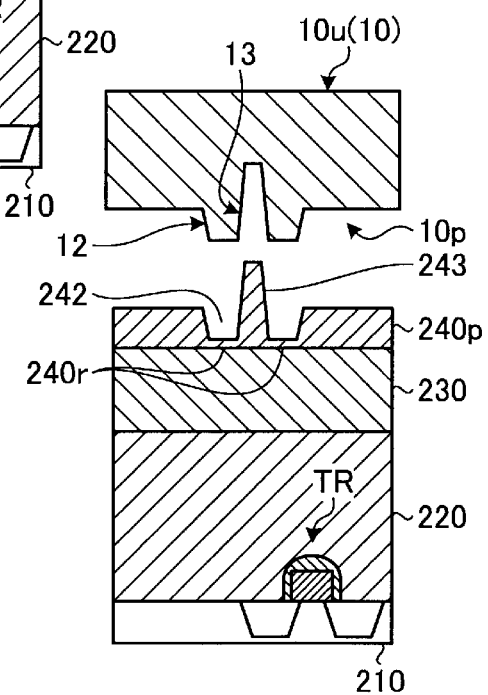
FIGS. 3A to 3C are cross-sectional views depicting aspects of a semiconductor device manufacturing method according to an embodiment.

Next, the replica template 10 is used in an imprint lithography process. FIGS. 3A to 3C show how the unit structure 10*u* of the pattern 10*p* in the replica template 10 is pressed against a resist film 240 formed on the carbon film 230.

As shown in FIG. 3A, the resist film 240 is formed on the carbon film 230 above the substrate 210. The pattern 10*p* of the replica template 10 having the step portion 12, the hole 13, and the like is placed in proximity to the resist film 240.

The resist film 240 may be, for example, a photocurable resist that is cured by light, a thermosetting resist that is cured by heating, or the like. Further, the resist film 240 can be formed by dispensing the resist as droplets onto a shot region, which is the region processed in each imprint process, or by applying the resist to the entire substrate 210 by spin coating or the like.

As shown in FIG. 3B, the pattern 10*p* of the replica template 10 is pressed against the resist film 240. Then, in this state, if the resist film 240 is a photocurable resist, it is irradiated with light, or if the resist film 240 is a thermosetting resist, it is heated to cure the resist film 240.

When the replica template 10 is pressed against the resist film 240, a slight distance from the lower carbon film 230 is maintained in order to prevent the replica template 10 from contact with the substrate 210 and the like, which might damage the replica template.

As shown in FIG. 3C, the replica template 10 is released after the resist film 240 is cured. The resist film 240 becomes a resist pattern 240*p* to which the pattern 10*p* of the replica template 10 has been transferred.

The resist pattern 240*p* includes a groove 242 corresponding to the step portion 12 of the replica template 10 and a pillar 243 corresponding to the hole 13. The groove 242 has a shape recessed in the film thickness direction of the resist pattern 240*p*, and the pillar 243 has a shape protruding from the bottom surface of the groove 242. The resist pattern 240*p* has a pattern in which topographic pattern of the pattern 10*p* of the replica template 10 has been inverted.

Since the replica template 10 is pressed against the resist film 240 with a slight distance from the carbon film 230 maintained, the resist pattern 240*p* includes a slight residual resist film 240*r* at the bottom surface of the groove 242.

Next, the pattern is sequentially transferred from the resist pattern 240p to the carbon film 230 and the insulating film 220. The related processing is shown in FIGS. 4A to 4F and 5A to 5F.

Figure 4A:
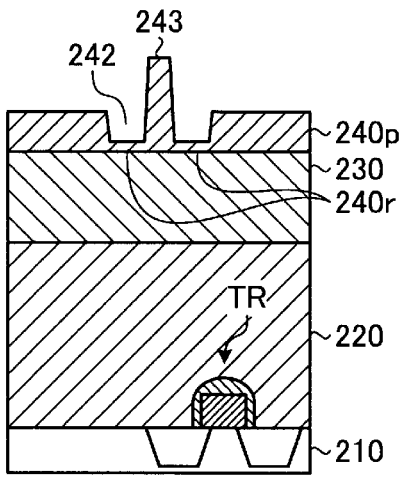
FIGS. 4A to 4F are cross-sectional views depicting aspects of a semiconductor device manufacturing method according to an embodiment.

FIG. 4A shows the state after the imprint process shown in FIG. 3C.

Figure 4D:
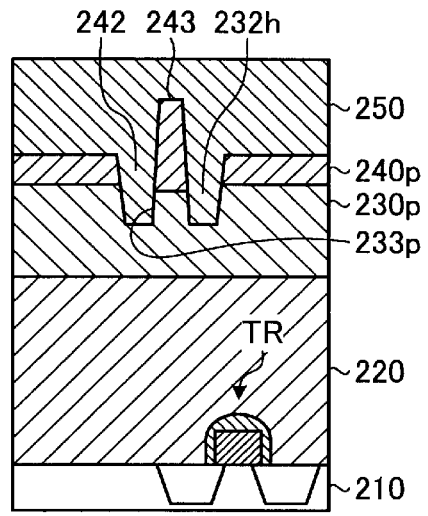
Figure 4B:
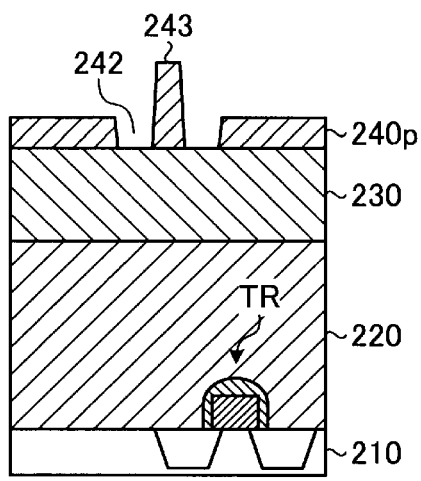

As shown in FIG. 4B, the resist pattern 240p is etched to remove the resist residual film 240r.

Figure 4E:
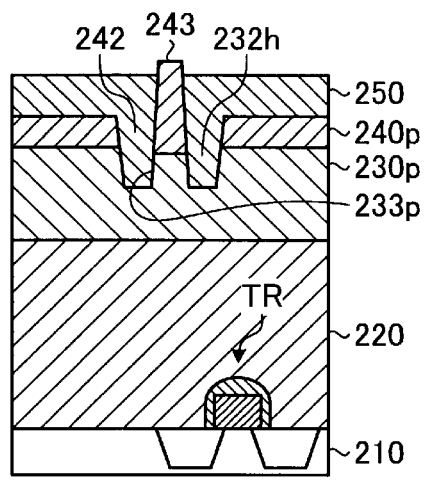
Figure 4C:
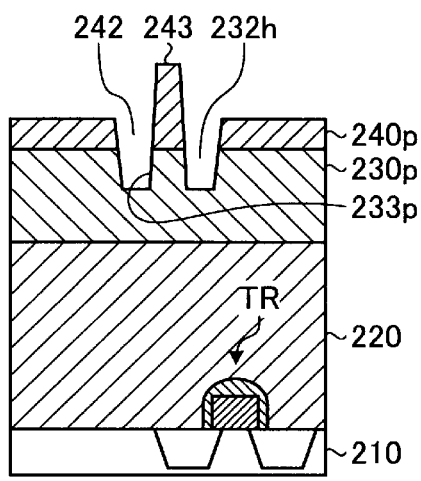

As shown in FIG. 4C, the carbon film 230 is then partially etched. As a result, a portion of the carbon film 230 below the now-removed resist residual film 240r is etched to form a carbon film pattern 230p including a shallow groove 232h recessed to a predetermined depth in the film thickness direction of the carbon film 230 and a protrusion 233p disposed in the shallow groove 232h.

The resist pattern 240p and the carbon film 230 are made of similar materials, each containing a large amount of carbon. Therefore, for example, the carbon film 230 can be etched in the same removal process of the resist residual film 240r shown in FIG. 4B, that is, under the same etching conditions or similar etching conditions.

Further, in the process of FIG. 4C, the carbon film 230 was approximately half-etched to form the shallow groove 232h, but at this stage, in other examples, a through groove entirely penetrating the carbon film 230 in the film thickness direction may be formed instead.

As shown in FIG. 4D, an inverted film 250 is formed covering the resist pattern 240p and the carbon film pattern 230p exposed from the resist pattern 240p. The inverted film 250 is made of a non-carbon material different from the resist pattern 240p and the carbon film pattern 230p, and is, for example, an oxide film such as a silicon oxide film formed from a spin-on-glass (SOG) material.

By only partially etching through the carbon film 230 and leaving a part thereof remaining, the height difference of the uneven portion of the resist pattern 240p and the carbon film pattern 230p can be reduced, and the inverted film 250 can be more easily formed to have a flat upper surface.

As shown in FIG. 4E, the inverted film 250 is etched back to expose a part of the pillar 243 of the resist pattern 240p at the upper surface of the inverted film 250. At this time, the amount of the pillar 243 exposed can be adjusted as appropriate. It is generally sufficient if at least the top (uppermost surface) of the pillar 243 is exposed from the upper surface of the inverted film 250.

Since the inverted film 250 is made of a non-carbon material different from the resist pattern 240p, the selection ratio (etch selectivity) with respect to the resist pattern 240p can be increased, the inverted film 250 can be selectively etched to expose the pillar 243 of the resist pattern 240p without substantial removal of the pillar 243 material.

Figure 4F:
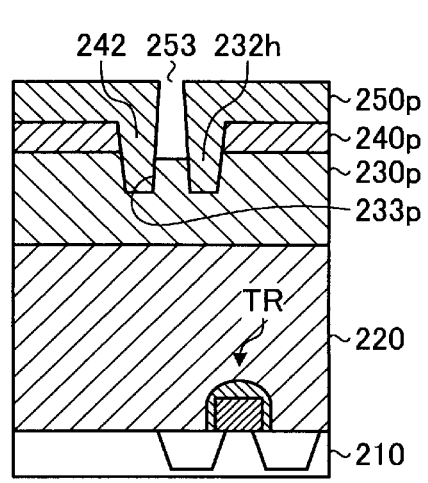

As shown in FIG. 4F, next the pillar 243 previously exposed from the upper surface of the inverted film 250 is removed. At this time, it is possible to set processing conditions for selectively etching the pillar 243 of the resist pattern 240p with respect to the inverted film 250 by utilizing the material differences between the inverted film 250 and the resist pattern 240p.

As a result, an inverted film pattern 250p having a hole 253 is generated by removing the pillar 243. The hole 253 opens on the protrusion 233p of the carbon film pattern 230p.

Figure 5A:
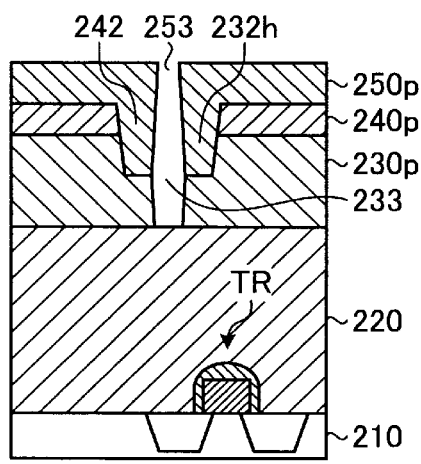
FIGS. 5A to 5F are cross-sectional views depicting aspects of a semiconductor device manufacturing method according to an embodiment.

As shown in FIG. 5A, the protrusion 233p is removed by etching through the hole 253 of the inverted film pattern 250p. Also at this time, the carbon film pattern 230p can be selectively etched while ensuring the selection ratio of the inverted film pattern 250p by utilizing the material difference between the inverted film pattern 250p and the carbon film pattern 230p.

As a result, a hole 233 that opens at the bottom surface of the shallow groove 232h of the carbon film pattern 230p is formed.

That is, by the processes up to this point, the pillar 243 formed in the groove 242 of the resist pattern 240p has been turned into the hole 233 penetrating the inside of the carbon film pattern 230p in the depth direction. As described above, the inverted film 250 has a function of inverting the pattern of the resist pattern 240p.

Figure 5B:
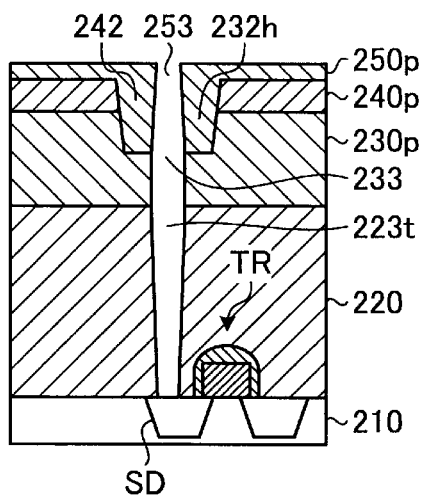

As shown in FIG. 5B, the insulating film 220 is etched through the hole 253 of the inverted film pattern 250p and the hole 233 of the carbon film pattern 230p. In the example of the present embodiment, the inverted film pattern 250p and the insulating film 220 are both silicon-based oxide films and are made of similar materials. Therefore, it is generally difficult to secure etch selectivity between the inverted film pattern 250p and the insulating film 220. However, by appropriately setting the film thickness of the inverted film 250 that is formed, the film thickness of the inverted film pattern 250p can be sufficiently maintained until the etching of the insulating film 220 is completed.

As a result, a through via hole 223t is formed in the insulating film 220. The through via hole 223t penetrates the insulating film 220 and reaches, for example, the source and drain SD of the transistor TR formed on the substrate 210.

Figure 5C:
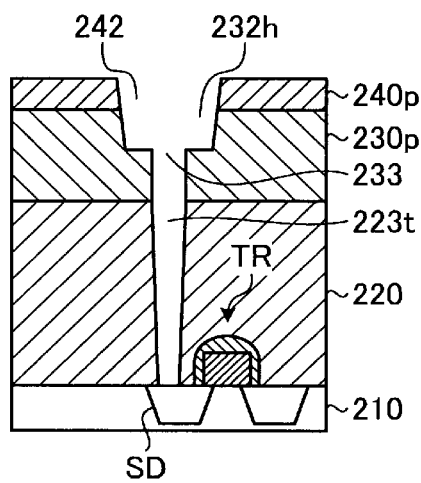

As shown in FIG. 5C, the remaining inverted film pattern 250p can be selectively etched and removed while ensuring an appropriate selection ratio with the resist pattern 240p.

Figure 5D:
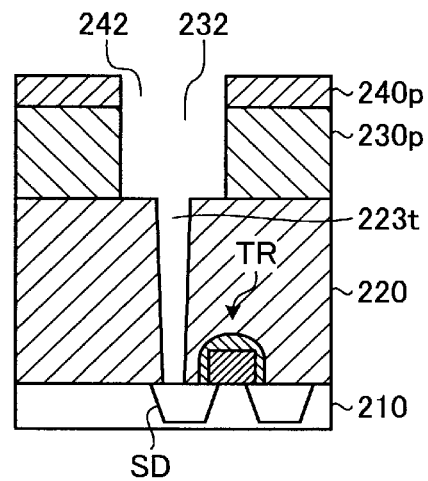

As shown in FIG. 5D, the shallow groove 232h of the carbon film pattern 230p is additionally etched to form a through groove 232 in the carbon film pattern 230p. At this time, the carbon film pattern 230p is selectively etched while ensuring a selection ratio with the insulating film 220.

The opening of the through via hole 223t is exposed at the bottom surface of the through groove 232. As described above, by ensuring the selection ratio between the insulating film 220 and the carbon film pattern 230p, etching of the edge portion of the opening of the through via hole 223t is prevented. The edge portion of the opening of the through via hole 223t may be referred to as a shoulder portion, a rim of the opening, an upper edge of the opening, or the like. The shape of the bottom surface of the through groove 232 can be adjusted so that the shape of the bottom surface of the through groove 232 of the carbon film pattern 230p becomes flat.

Figure 5E:
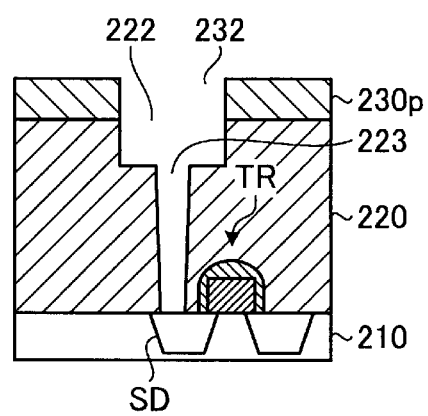

As shown in FIG. 5E, the insulating film 220 is etched using the resist pattern 240p and the carbon film pattern 230p as masks. In this process, it is difficult to secure a selection ratio between the resist pattern 240p and the carbon film pattern 230p. However, even if the resist pattern 240p is removed completely, it can still be sufficient if the carbon film pattern 230p (or some portion thereof) remains until the etching of the insulating film 220 is completed.

By the above etching, a wiring groove 222 having a predetermined depth is formed on the upper portion of the insulating film 220. As a result, the upper portion of the through via hole 223t of the insulating film 220 is removed, and a via hole 223 to which the wiring groove 222 is connected is formed. Since the carbon film pattern 230p remains until the etching is completed, the edge portion of the opening of the wiring groove 222, that is, the shoulder opening of the wiring groove 222 remains protected.

Figure 5F:
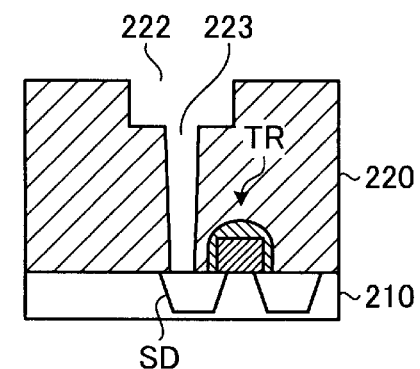

As shown in FIG. 5F, the carbon film pattern 230p is removed by etching while ensuring the selection ratio with the insulating film 220.

As described above, the via hole 223 to which the wiring groove 222 is connected can be collectively formed in the insulating film 220 from a resist pattern 240p in which the pillar 243 protrudes from the bottom surface of the groove 242.

Figure 6:
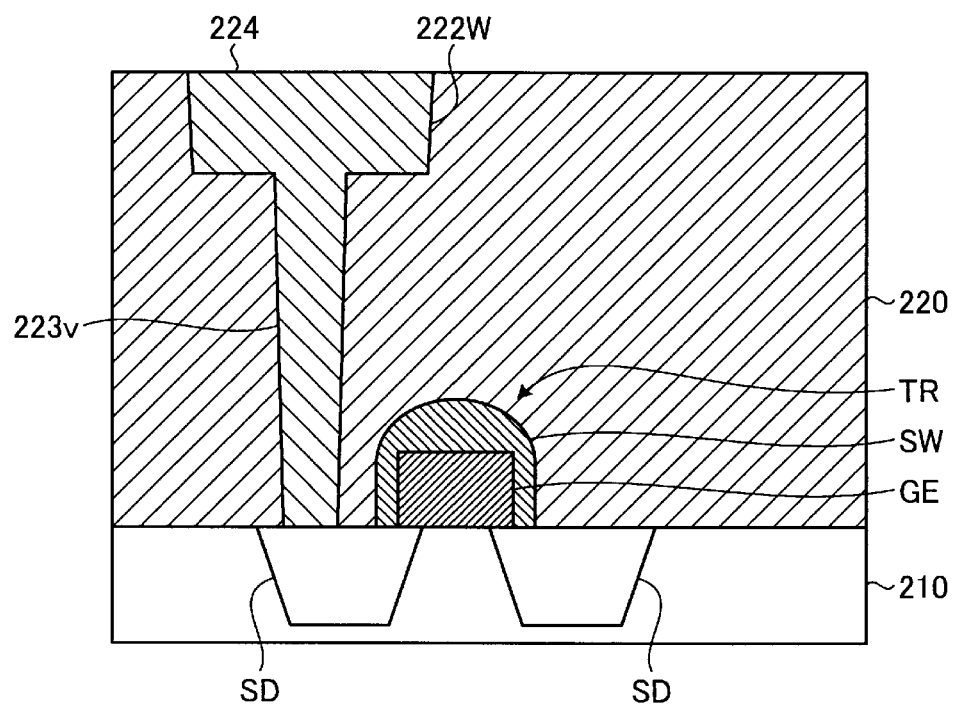
FIG. 6 is cross-sectional view depicting aspects of a semiconductor device manufacturing method according to an embodiment.

After that, the via hole 223 and the wiring groove 222 of the insulating film 220 are filled with a metal material such as tungsten or copper. FIG. 6 depicts the process.

As shown in FIG. 6, the semiconductor device 200 of the embodiment is manufactured by an imprint method using the replica template 10 and a dual damascene method using the resist pattern 240p pattern created by the imprint method.

The semiconductor device 200 includes the transistor TR, the via 223v, and the upper layer wiring 222w. A substrate 210 may be provided in the semiconductor device 200. As described above, the transistor TR is disposed on the substrate 210. The lower end of the via 223v is connected to the source and drain SD of the transistor TR. The upper end of the via 223v is connected to the upper layer wiring 222w. The via 223v and the upper layer wiring 222w have a metal material 224 filled in the via hole 223 and the wiring groove 222 described above. As a result, the source and drain SD of the transistor TR and the upper layer wiring 222w are electrically connected.

In the processing examples shown in FIGS. 2A to 6, the via 223v and the upper layer wiring 222w connected to the source and drain SD of the transistor TR are formed. However, the manufacturing method of the semiconductor device 200 of the embodiment can also be applied to, for example, the case of forming a via and an upper layer wiring connected to the gate GE of the transistor TR.

Further, in the processing examples shown in FIGS. 2A to 6, the lower layer structure is a transistor TR. However, the manufacturing method of the semiconductor device 200 can also be applied to the case of forming a via and an (upper layer) wiring connected to, for example, the upper layer wiring 222w or a wiring further above the upper layer wiring 222w.

Further, in the process example shown in FIGS. 2A to 6, the semiconductor device 200 is disposed on the substrate 210. However, the semiconductor device may be disposed on a substrate other than a semiconductor substrate, such as, for example, a ceramic substrate, a glass substrate, or a quartz substrate.

[Structure of Master Template]

Figure 7A:
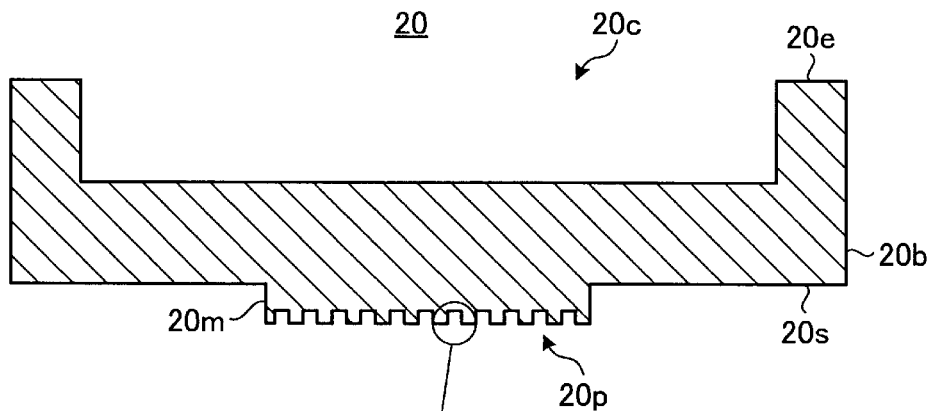
FIGS. 7A to 7C are diagrams showing an example of the configuration of a master template according to an embodiment.
Figure 7B:
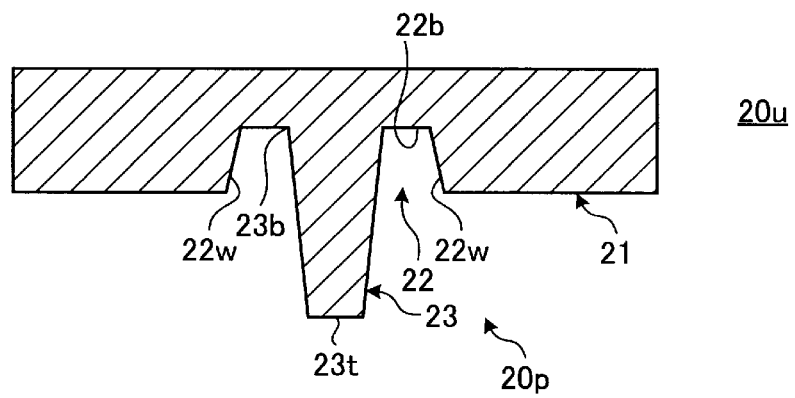
Figure 7C:
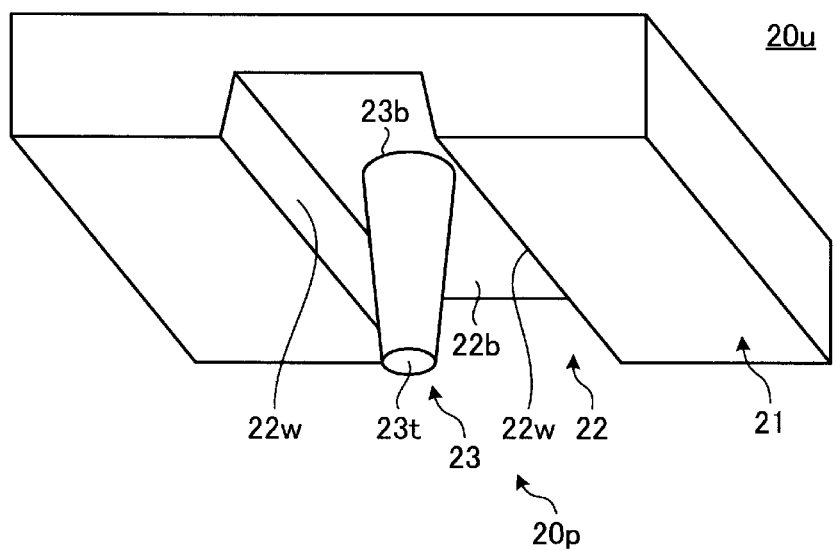

Next, the configuration of a master template 20 of the embodiment will be described with reference to FIGS. 7A to 7C. FIGS. 7A to 7C are diagrams showing an example of the configuration of the master template 20 according to an embodiment. FIG. 7A is a cross-sectional view, FIG. 7B is a partially enlarged cross-sectional view, and FIG. 7C is a partial perspective view.

The master template 20 is a template for imprinting. The master template 20 may be referred to as an original plate, an original mold, a master, a master mold, or the like. Th master template 30 has a pattern 20p that can be transferred to a resist film on a template blank or the like to be processed into a replica template 10. A plurality of replica template 10 can be produced from a single master template 20.

As shown in FIG. 7A, the master template 20 includes a base material 20b made of a transparent material such as glass or quartz. On a main surface 20s of the base material 20b, a mesa portion 20m protruding from the main surface 20s is disposed. The mesa portion 20m is disposed in the center of the base material 20b, for example. The other main surface 20e of the base material 20b is provided with a counterbore 20c in which a part of the base material 20b is removed from the other main surface 20e side.

The pattern 20p is disposed on the upper surface of the mesa portion 20m. The pattern 20p has, for example, a periodic structure in which a predetermined unit structure 20u is periodically repeated. FIGS. 7B and 7C depict extracted unit structures 20u of the pattern 20p in FIG. 7A.

As shown in FIGS. 7B and 7C, the unit structure 20u of the pattern 20p is disposed on a basal plane 21 of the mesa portion 20m. The unit structure 20u includes, for example, a groove 22 having a bottom portion recessed from the basal plane 21 to a predetermined depth, and a pillar 23 disposed at the bottom portion of the groove 22.

The groove 22 extends in a predetermined direction along the basal plane 21, and has a bottom surface 22b and side surfaces 22w. The bottom surface 22b is, for example, rectangular and has a substantially flat surface. Each side surface 22w extends from the bottom surface 22b to the basal plane 21. The two side surfaces 22w are substantially parallel to each other in the extending direction. However, the groove 22 may have a tapered shape with the distance between the two side surfaces 22w increased from the bottom surface 22b toward the basal plane 21.

The groove 22 may be bent or angle in various directions and may extend in a curved shape or a serpentine shape, instead of extending in just a single direction or in a straight line.

The pillar 23 has a base portion 23b on the bottom surface 22b of the groove 22 and extends from the bottom surface 22b to a predetermined height. The pillar 23 has a substantially flat upper surface 23t at the top. The height of the pillar 23 from the base portion 23b to the upper surface 23t is larger than the depth of the groove 22 from the basal plane 21. Therefore, the upper surface 23t of the pillar 23 is located higher than the basal plane 21 and protrudes from the basal plane 21.

It is desirable that the cross section of the pillar 23 orthogonal to the height direction has a rounded shape such as a circular shape, an elliptical shape, or an oval shape, that is, a shape having no corners. Further, the pillar 23 may have a tapered shape with the diameter of the base portion 23b being larger than the diameter of the pillar 23 at the upper surface 23t.

[Manufacturing Method of Master Template]

Next, a manufacturing method of the master template 20 of the present embodiment will be described with reference to FIGS. 8A to 8F and 9A to 9D. FIGS. 8A to 8F and 9A to 9D are cross-sectional views showing an example of the procedure of the manufacturing method of the master template 20 according to the embodiment.

Figure 8A:
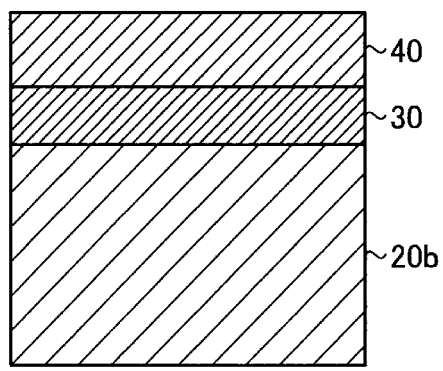
FIGS. 8A to 8F are cross-sectional views depicting aspects of a master template manufacturing method according to an embodiment.

As shown in FIG. 8A, a hard mask (HM) film 30, which is a film containing a metal such as chromium, molybdenum, tantalum, or the like, or carbon is formed on the base material 20b made of glass, quartz, or the like in a flat shape. At this time, in consideration of the subsequent processes, the HM film 30 is made thicker than might otherwise be usual. Next, a resist film 40, which in this example is a resin film suitable for electron beam (EB) drawing (patterning), is formed on the HM film 30.

Figure 8D:
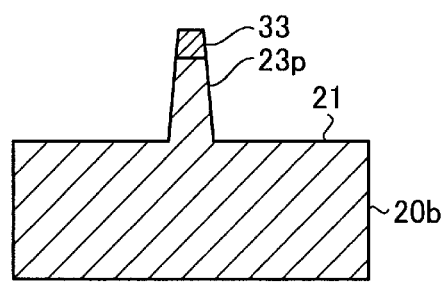
Figure 8B:
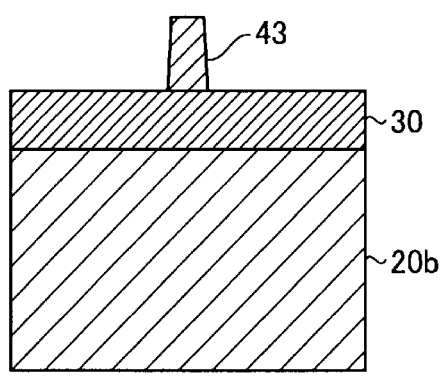

As shown in FIG. 8B, the resist film 40 is processed by EB drawing to form a pillar 43 composed of the resist film 40.

Figure 8E:
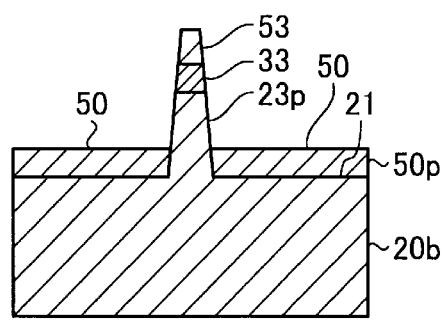
Figure 8C:
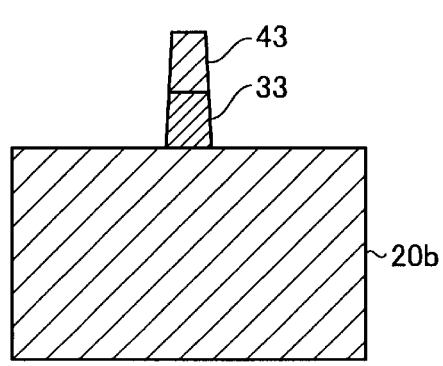

As shown in FIG. 8C, the HM film 30 is etched using the pillar 43 as a mask to form a pillar 33 composed of the HM film 30. As a result, the surface of the base material 20b is exposed except for the portion where the pillars 43 and 33 are formed.

As shown in FIG. 8D, the exposed surface of the base material 20b is etched using the pillar 33 as a mask. As a result, the surface of the base material 20b is removed by a predetermined thickness, and the base material 20b has an etched surface. This etched surface becomes the basal plane 21 of the master template 20.

As a result, a protrusion 23p protruding from the basal plane 21 of the base material 20b is formed. At this time, the pillar 43 may be removed. However, since the HM film 30 was thick, a part of the pillar 33 still remains. In other words, the thickness of the HM film 30 is set in the processing of FIG. 8A so that at least a part of the pillar 33 remains after the processing of FIG. 8D.

As shown in FIG. 8E, a material comprising a metal, such as chromium, molybdenum, tantalum, or carbon is sputtered onto the base material 20b including the pillar 33 of the protrusion 23p. As a result, an HM film 50 having a predetermined thickness is formed on the basal plane 21 of the base material 20b and a pillar 53 composed of the sputtered (or otherwise deposited) material is formed on the pillar 33. As a result, an HM pattern 50p having the HM film 50 and the pillars 33 and 53 are formed.

Here, the material member sputtered on the base material 20b may be, for example, the same material as the material constituting the HM film 30, or may be a different material. Further, the characteristics of the HM film 30 and the HM pattern 50p, such as etching resistance, may be different. When the HM film 30 and the HM pattern 50p are made of the same material, the characteristics of the two can be made different by, for example, different sputtering conditions. When the HM film 30 and the HM pattern 50p are different materials, the characteristics of the two can be made different by selecting the respective materials.

For etching the base material 20b, it is preferable that the etching resistance of the HM film 30 is higher than the etching resistance of the HM pattern 50p. In other words, the pillar 33 composed of the HM film 30 is required to have higher etching resistance.

Figure 8F:
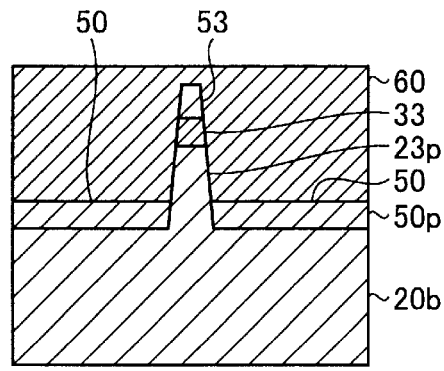

As shown in FIG. 8F, a resist film 60 is formed to cover the entire HM pattern 50p. The resist film 60 is a resin film suitable for EB drawing.

Figure 9A:
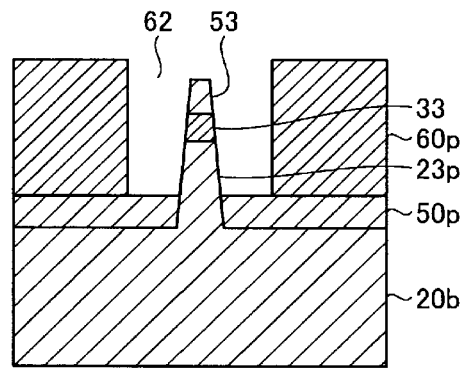
FIGS. 9A to 9D are cross-sectional views depicting aspects of a master template manufacturing method according to an embodiment.

As shown in FIG. 9A, the resist film 60 is processed by EB drawing to form a resist pattern 60p having a through groove 62 reaching the HM pattern 50p. As a result, a part of the HM film 50 of the HM pattern 50p and all of the pillar 33 and the pillar 53 are exposed.

Figure 9B:
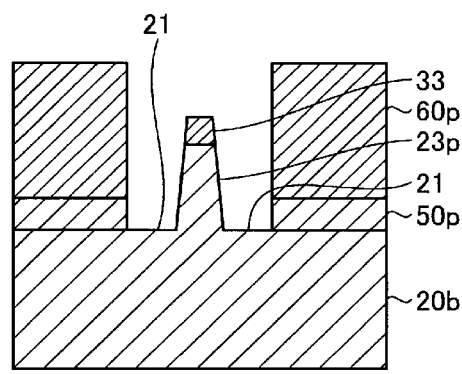

As shown in FIG. 9B, the HM pattern 50p is etched using the resist pattern 60p as a mask. As a result, a part of the HM film 50 of the HM pattern 50p is removed and a part of the basal plane 21 of the base material 20b is exposed. Further, since the pillar 53 of the HM pattern 50p is removed so as to have a film thickness substantially equal to that of the HM film 50 and the upper surface of the pillar 33 is exposed.

Figure 9C:
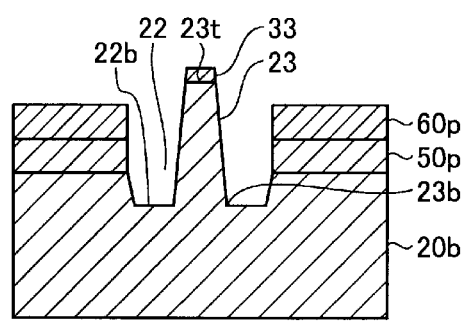

As shown in FIG. 9C, the base material 20b is etched using the resist pattern 60p and the HM pattern 50p as masks. As a result, the groove 22 recessed from the basal plane 21 to a predetermined depth is formed in the base material 20b. As a result, the pillar 23 having the base portion 23b is formed on the bottom surface 22b of the groove 22. At this time, at least a part of the pillar 33 of the HM pattern 50p remains and the upper surface 23t of the pillar 23 is protected until the etching is completed.

Figure 9D:
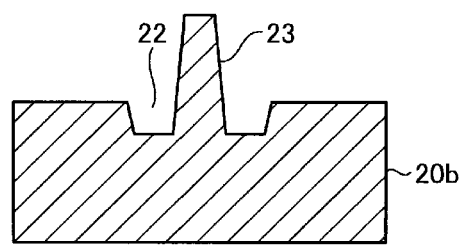

As shown in FIG. 9D, the resist pattern 60p and the HM pattern 50p are removed.

[Manufacturing Method of Replica Template]

Next, a method of manufacturing the replica template 10 of the embodiment will be described with reference to FIGS. 10A to 12B. FIGS. 10A to 12B are cross-sectional views showing an example of the procedure of the manufacturing method of the replica template 10 according to the embodiment.

As shown in FIG. 10A, an HM film 130, which is a film containing a metal such as chromium, molybdenum, tantalum, or the like, or carbon, is formed on the base material 10b, which is made of glass, quartz, or the like. A photocurable or thermosetting resist film 140 is formed on the HM film 130.

The HM film 130 does not have to be particularly thick in this process. The resist film 140 can be locally dispensed onto each shot region of the base material 10b or applied to the entire base material 10b by spin coating or the like.

The resist film 140 formed on the base material 10b is brought into proximity with the pattern 20p of the master template 20 having the groove 22, the pillar 23, and the like.

As shown in FIG. 10B, the pattern 20p of the master template 20 is pressed against the resist film 140. Then, in this state, the resist film 140 is irradiated with light, or the resist film 140 is heated to cure the resist film 140.

As shown in FIG. 10C, the master template 20 is released after the resist film 140 is cured. The resist film 140 becomes a resist pattern 140p to which the pattern 20p of the master template 20 has been transferred.

The resist pattern 140p has a step portion 142 to which the groove 22 of the master template 20 corresponds, and a hole 143 to which the pillar 23 of the master template 20 corresponds. The step portion 142 protrudes from the upper surface of the resist pattern 140p, and the hole 143 has a shape recessed from the upper surface of the step portion 142 in the film thickness direction of the resist pattern 140p. The resist pattern 140p includes a resist residual film 140r at the bottom of the hole 143.

Figure 11A:
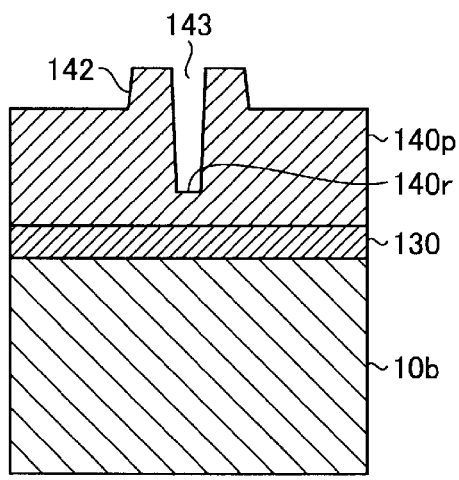
FIGS. 11A to 11F are cross-sectional views depicting aspects of a master template manufacturing method according to an embodiment.

FIG. 11A shows the state after the imprint process shown in FIG. 10C.

Figure 11D:
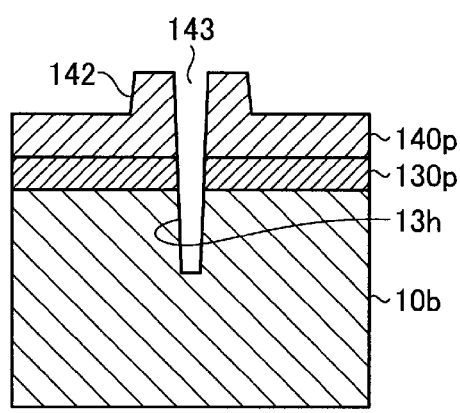
Figure 11B:
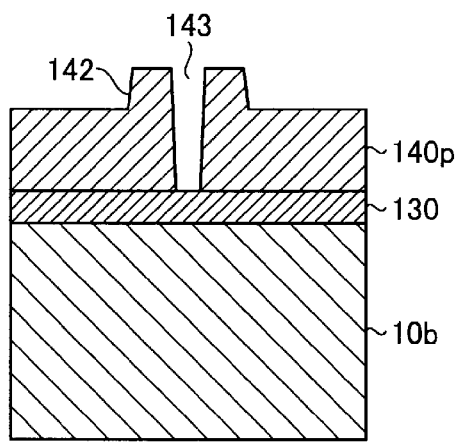

As shown in FIG. 11B, the resist pattern 140p is etched to remove the resist residual film 140r.

Figure 11E:
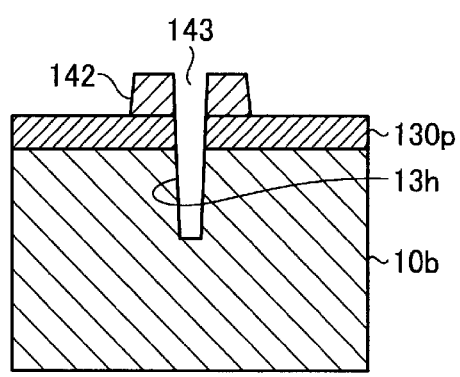
Figure 11C:
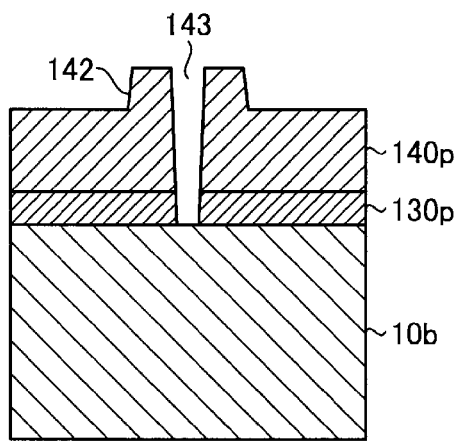

As shown in FIG. 11C, the HM film 130 is etched using the resist pattern 140p as a mask. As a result, an HM pattern 130p is formed through the portion of the resist pattern 140p corresponding to the hole 143.

As shown in FIG. 11D, etching with the resist pattern 140p as a mask is continued and the base material 10b exposed from the penetrating portion of the HM pattern 130p is etched. As a result, a shallow hole 13h is formed in the base material 10b. The shallow hole 13h is a configuration corresponding to the hole 13 of the replica template 10 and is a hole shallower than the hole 13. The shallow hole 13h is later further etched to become the hole 13 having a predetermined depth.

As shown in FIG. 11E, the resist pattern 140p is etched back. As a result, the step portion 142 having the hole 143 of the resist pattern 140p remains on the HM pattern 130p.

Figure 11F:
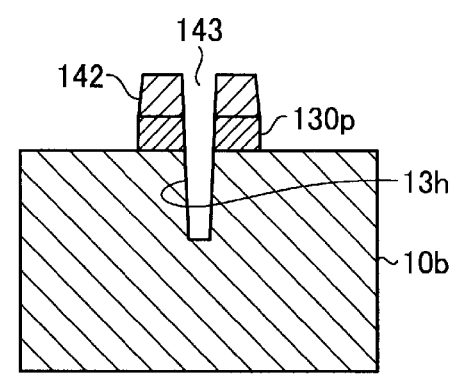

As shown in FIG. 11F, the HM pattern 130p is etched using the step portion 142 of the resist pattern 140p as a mask. As a result, the step portion 142 of the resist pattern 140p and the HM pattern 130p below the step portion 142 remain on the base material 10b.

Figure 12A:
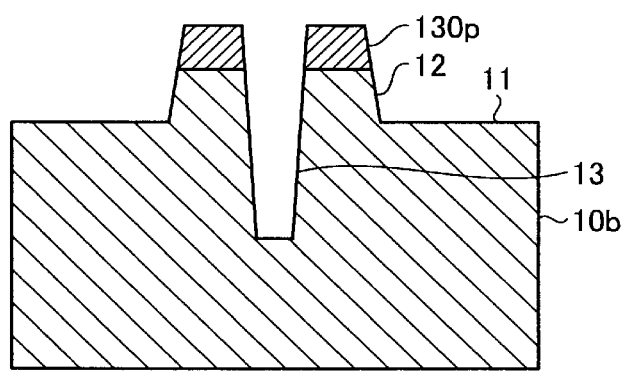
FIGS. 12A and 12B are cross-sectional views depicting aspects of a master template manufacturing method according to an embodiment.

As shown in FIG. 12A, the base material 10b is etched using the step portion 142 of the resist pattern 140p and the HM pattern 130p below the step portion 142 as masks. As a result, the surface of the base material 10b is removed by a predetermined thickness, and the base material 10b has an etched surface. This etched surface becomes the basal plane 11 of the replica template 10.

The base material 10b below the HM pattern 130p protrudes from the etched surface of the base material 10b. That is, the basal plane 11 and the step portion 12 are formed. Now the shallow hole 13h is further etched to form the hole 13 having a predetermined depth.

Figure 12B:
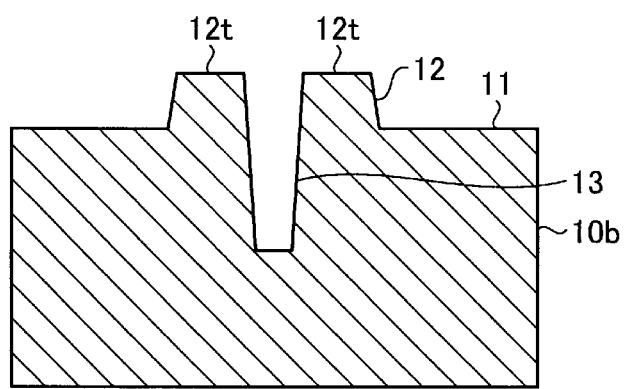

As shown in FIG. 12B, the HM pattern 130p is removed from the upper surface 12t of the step portion 12 of the base material 10b.

Comparative Example

Next, a manufacturing method of a semiconductor device of a comparative example will be described with reference to FIGS. 13A to 13F and 14A to 14C'.

Figure 13A:
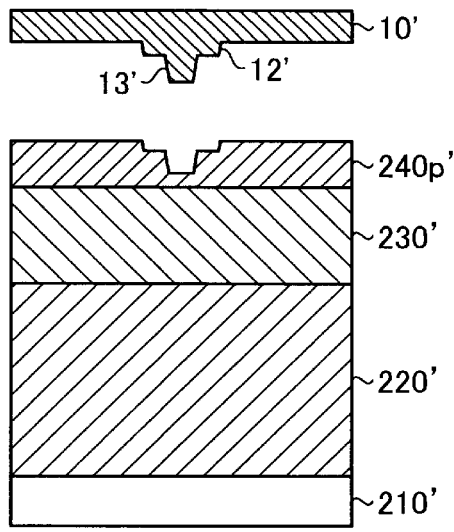
FIGS. 13A to 13F are cross-sectional views showing an example of a procedure of a semiconductor device manufacturing method of according to a comparative example.
Figure 13B:
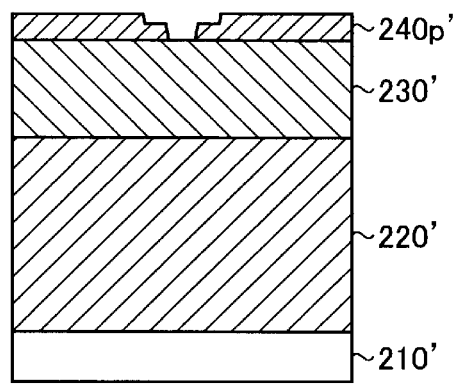

As shown in FIG. 13A, a replica template 10' of the comparative example has a step portion 12' and a pillar 13' protruding on the step portion 12'.

Figure 13C:
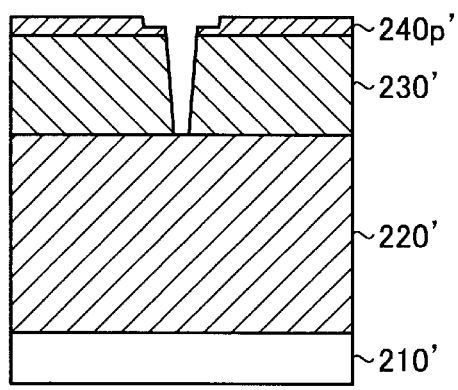
Figure 13D:
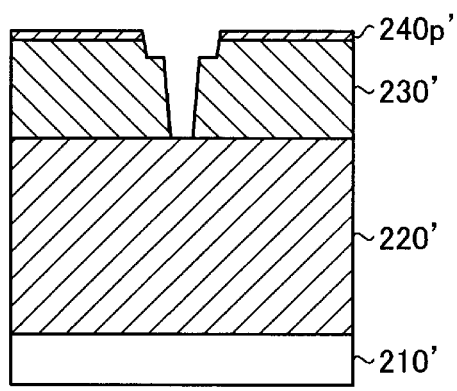
Figure 13E:
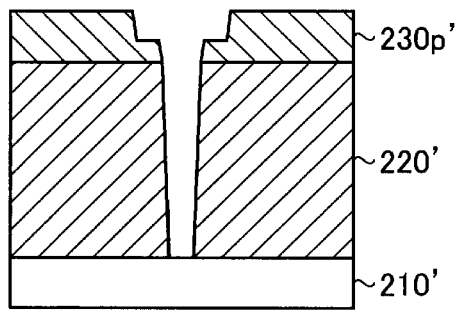
Figure 13F:
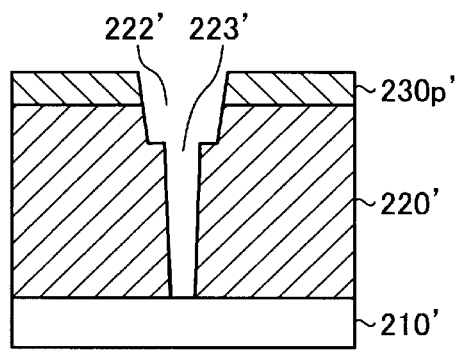

An insulating film 220', a carbon film 230', and a resist film are formed on a substrate 210' in this order, and the above replica template 10' is pressed into the resist film to form a resist pattern 240p' having grooves and holes on the carbon film 230' (FIG. 13A). The resist residual film of the resist pattern 240p' is removed (FIG. 13B), and the hole of the resist pattern 240p' is transferred to the carbon film 230' to form a carbon film pattern 230p' (FIG. 13C). The groove of the resist pattern 240p' is transferred to the carbon film pattern 230p' (FIG. 13D). Next, the hole of the carbon film pattern 230p' is transferred to the insulating film 220' (FIG. 13E), the groove of the carbon film pattern 230p' is transferred to the insulating film 220', and a via hole 223' and a wiring groove 222' are formed (FIG. 13F).

Figure 14A:
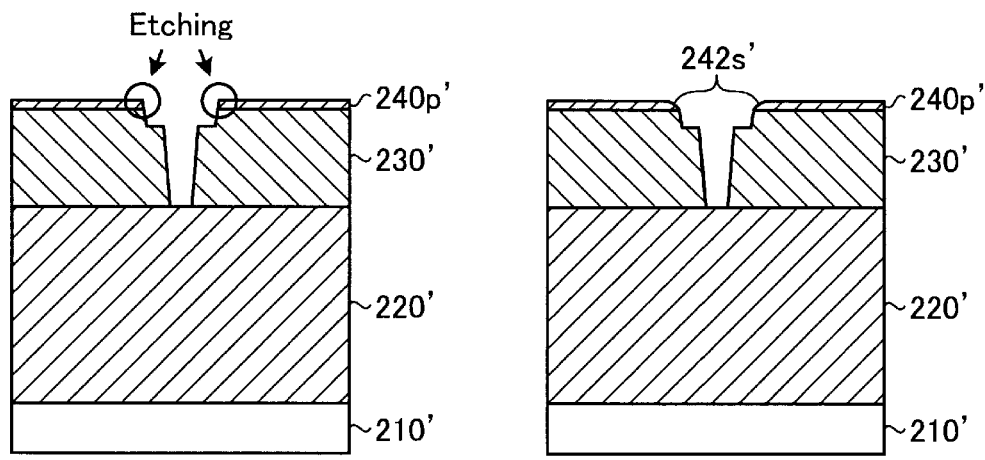
FIGS. 14A to 14C are cross-sectional views showing an example of a procedure of a semiconductor device manufacturing method according to the comparative example.
Figure 14B:
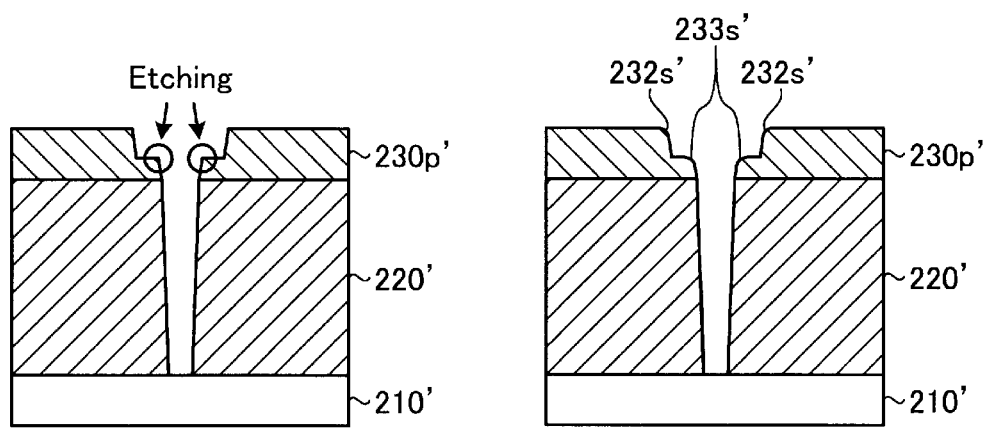
Figure 14C:
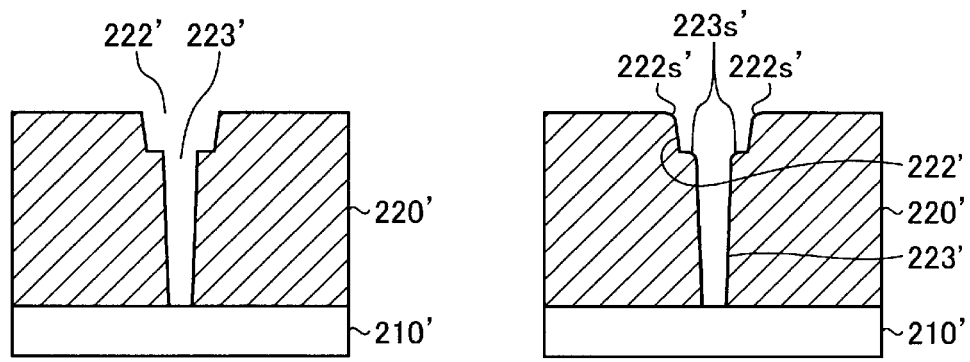

However, the manufacturing method of the semiconductor device of the comparative example has various problems shown in FIGS. 14A to 14C.

As shown in FIG. 14A, in the process of transferring the groove of the resist pattern 240p' to the carbon film pattern 230p', the selection between resist pattern 240p' and the carbon film 230' must be low to permit the groove of the resist pattern 240p' to be transfer to carbon film pattern 230p'. Therefore, a shoulder opening (upper edge) of the groove in the resist pattern 240' will be easily removed in the etching. For example, as shown in FIG. 14A (right page side), a shoulder opening 242s' of the groove may have a rounded shape, or the width of the groove may widen from that of the initial resist pattern 240p'.

As shown in FIG. 14B, in the process of transferring the groove of the carbon film pattern 230p' to the insulating film 220', the selection ratio between the carbon film pattern 230p' and the insulating film 220' must be low to permit the groove of the carbon film pattern 230p' to transfer to the insulating film 220'. Therefore, a shoulder opening of the hole of the carbon film pattern 230p' is easily removed in the etching. For example, as shown in FIG. 14B (right page side), a shoulder opening 233s' of the hole may have a rounded shape or the hole diameter may widen from the initial pattern dimension. Furthermore, since the penetration of the groove of the carbon film pattern 230p' and the transfer to the insulating film 220' are performed in the same process, it can be difficult to make the depth of the bottom surface of the groove uniform and the flatness of the bottom surface is likely to be impaired. Further, the shape of the groove of the resist pattern 240p' in FIG. 14A (right page side) is transferred to the groove of the carbon film pattern 230p', and there is nothing to protect a shoulder opening of the groove of the carbon film pattern 230p' when the groove is transferred to the insulating film 220', and a groove shoulder opening 232s' of the carbon film pattern 230p' tends to have a more rounded shape. The width of the groove may thus widen.

As a result, instead of obtaining the ideal shape shown in FIG. 14C (left page side) in the insulating film 220', for example, a shoulder opening 222s' of the wiring groove 222' and a shoulder opening 223s' of the via hole 223' may have a rounded shape as shown in FIG. 14C (right page side). In addition, the dimensional difference between the wiring groove 222' and the via hole 223' may become large. Furthermore, the depths of the wiring grooves 222' are not uniform, and the flatness of the bottom surface of the wiring grooves 222' may be impaired.

However, according to the manufacturing method of the semiconductor device 200, the carbon film 230 and the resist film 240 (which are made of the same kind of materials) and the inverted film 250 (which is made of a different material) are used in combination with each other. As a result, various processes can be performed while appropriately securing an advantageous selection ratio therebetween. Therefore, it becomes easier to obtain a desired shape in the insulating film 220.

For example, in the process of inverting the pillar 243 of the resist pattern 240p and transferring the pillar 243 as the hole 233 of the carbon film pattern 230p shown in FIG. 5A, the shoulder opening of the groove 242 of the resist pattern 240p is protected by the inverted film pattern 250p. As a result, the shape of the groove 242 can be maintained.

Furthermore, the resist pattern 240p is protected by the inverted film pattern 250p during the processes of FIGS. 4D to 5B. Therefore, the process of completely transferring the groove 242 of the resist pattern 240p to the carbon film pattern 230p (as the through groove 232) as shown in FIG. 5D can be performed with the resist pattern 240p having a sufficient film thickness. As a result, the shape of the groove 242 of the resist pattern 240p can be more easily transferred to the through groove 232 of the carbon film pattern 230p with higher accuracy.

According to the manufacturing method of the semiconductor device 200 of an embodiment, the transfer of the dual damascene shape to the insulating film 220 is performed stepwise. This also facilitates obtaining a desired shape in the insulating film 220.

For example, the process of transferring the hole 233 of the carbon film pattern 230p to the insulating film 220 shown in FIG. 5B is performed in a state where the entire shoulder opening of the groove 242 and the entire shallow groove 232h are covered with the inverted film pattern 250p. As a result, the shapes of the groove 242 and the shallow groove 232h can be maintained during the process of transferring the hole 233 to the insulating film 220.

Furthermore the process of transferring the groove 242 to the carbon film pattern 230p shown in FIG. 5D, and the process of transferring the through groove 232 to the insulating film 220 shown in FIG. 5E are performed separately. That is, in the process shown in FIG. 5D, the through groove 232 is formed in the carbon film pattern 230p while ensuring the selection ratio with the insulating film 220, and the insulating film 220 functions as an etch stop film. As a result, the depths of the bottom surface 222b of the wiring groove 222 formed in the insulating film 220 can be easily aligned and the flatness of the bottom surface 222b can be easily obtained.

In order to make the bottom surface of the wiring groove uniform and flat, it is conceivable to include a stopper film at a predetermined depth within the insulating film and use this as the bottom surface of the wiring groove. However, this may increase parasitic capacitance (inter-wiring capacitance) of any insulating film including such a stopper film. By forming the through groove 232 and the wiring groove 222 separately, it becomes easier to obtain the desired shape of the wiring groove 222 without use of an embedded stopper film or the like.

According to the replica template 10 of an embodiment, the step portion 12 protruding from the basal plane 11 to a predetermined height and the hole 13 extending from the upper surface 12t of the step portion 12 to a predetermined depth are provided.

That is, the replica template 10 does not have a shape in which the pillar 13' protrudes as in the replica template 10' of the comparative example. As a result, in the replica template 10 that is frequently used, there is no risk that a structure like the pillar 13', which has low mechanical strength, will be damaged and the life of the replica template 10 can be extended.

Furthermore, unlike the replica template 10' of the comparative example composed of only the convex shape, the replica template 10 includes both the above-mentioned uneven shape and the height difference on the surface thereof is relatively small. Therefore, pattern transfer can be performed without increasing the resist film 240 thickness.

Further, if there is a slight height difference between the pillar 243 of the resist pattern 240p and the other surface of the resist pattern 240p, the pillar 243 can be exposed from the inverted film 250, so that an aspect ratio of the hole 13 of the replica template 10 can be kept low, and the height difference on the surface of the replica template 10 can be further reduced. The production of such a replica template 10 becomes easier.

The replica template 10 enables the manufacturing method of the semiconductor device 200, and the advantageous effects of the manufacturing method of the semiconductor device 200 of the embodiment described above are thus provided.

According to the master template 20 of the embodiment, the groove 22 recessed from the basal plane 21 to a predetermined depth, and the pillar 23 protruding higher than the basal plane 21 from the bottom surface 22b of the groove 22 are provided. The master template 20 having such a shape enables the production of the replica template 10 of the embodiment.

According to the manufacturing method of the master template 20 of the embodiment, the pattern 20p is formed in two steps: forming the protrusion 23p and forming the groove 22. As a result, the pillar 23 protruding from the bottom surface 22b of the groove 22 can be formed.

According to the manufacturing method of the master template 20 of the embodiment, the position where the protrusion 23p is formed and the position where the groove 22 is formed are aligned by EB drawing. As a result, the groove 22 can be aligned with respect to the position of the pillar 23 with high accuracy.

According to the manufacturing method of the master template 20 of the embodiment, the material to be sputtered, which becomes the HM pattern 50p, when forming the groove 22 is formed on the entire surface of the base material 20b in a state where the pillar 33 of the HM film 30 is left in the protrusion 23p. As a result, the pillars 33 and 53 on the protrusion 23p can be made thicker than the HM film 50 on the basal plane 21 of the base material 20b. Therefore, when the HM film 50 is opened to form the groove 22, at least the pillar 33 can be left on the protrusion 23p. Since the pillar 33 protects the protrusion 23p when the groove 22 is formed, the height of the protrusion 23p can be maintained, and thus an aspect ratio of the pillar 23 can be maintained.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An original plate for imprint lithography, the original plate comprising:
a first surface side having a patterned portion including:
a groove extending along a first direction and having a bottom surface recessed from a first surface to a first depth in a second direction that is orthogonal to the first surface and a side surface extending from the bottom surface to the first surface in the second direction, and
a columnar portion on the bottom surface of the groove and protruding from the bottom surface in the second direction to extend to a height beyond the first surface.

2. The original plate according to claim 1, wherein
the groove has a generally rectangular planar shape when viewed from a direction orthogonal to the first surface, and
the columnar portion is circular, elliptical, or oval-shaped when viewed from the direction orthogonal to the first surface.

3. The original plate according to claim 1, wherein the original plate comprises a substrate material that is transparent to light.

4. The original plate according to claim 1, wherein the patterned portion is on a mesa portion protruding outward on the first surface side.

5. The original plate according to claim 4, further comprising:
a counterbore region on a second surface side opposite the first surface side.

6. A method of making a template for imprint lithography using an original plate according to claim 1, the method comprising:
placing an imprint resist material on a first substrate surface;
imprinting the imprint resist material with the original plate according to claim 1 so that a pattern on the first surface side of the original plate according to claim 1 is transferred to the imprint resist material as an inverse pattern; and
transferring the inverse pattern into the first substrate surface by etching.

7. A template for imprint lithography, the template comprising:
a first surface side having a patterned portion including:
a step portion protruding from a first surface to a first height and extending in a first direction along the first surface, and
a hole in the step portion extending in a second direction into the template and having a bottom that is at a level below the first surface in the second direction.

8. The template according to claim 7, wherein
the step portion has a generally rectangular planar shape when viewed from a direction orthogonal to the first surface, and
the hole has a planar shape that is circular, elliptical, or oval-shaped when viewed from the direction orthogonal to the first surface.

9. The template according to claim 7, wherein the template comprises a substrate material that is transparent to light.

10. The template according to claim 7, wherein the patterned portion is on a mesa portion protruding outward in the second direction from the first surface side.

11. The template according to claim 10, further comprising:
a counterbore region on a second surface side opposite the first surface side.

12. The template according to claim 7, further comprising:
a counterbore region on a second surface side opposite the first surface side.

13. An original plate for imprint lithography, the original plate comprising:
a first surface side having a patterned portion including:
a groove having a bottom surface recessed from a first surface to a first depth, and
a columnar portion on the bottom surface and protruding from the bottom surface to extend beyond the first surface; and
a counterbore region on a second surface side opposite the first surface side, wherein
the patterned portion is on a mesa portion protruding outward on the first surface side.

14. The original plate according to claim 13, wherein
the groove has a generally rectangular planar shape when viewed from a direction orthogonal to the first surface, and
the columnar portion is circular, elliptical, or oval-shaped when viewed from the direction orthogonal to the first surface.

15. The original plate according to claim 13, wherein the original plate comprises a substrate material that is transparent to light.

16. A method of making a template for imprint lithography using an original plate according to claim 13, the method comprising:
placing an imprint resist material on a first substrate surface;
imprinting the imprint resist material with the original plate according to claim 13 so that a pattern on the first surface side of the original plate according to claim 13 is transferred to the imprint resist material as an inverse pattern; and
transferring the inverse pattern into the first substrate surface by etching.

* * * * *